United States Patent
Sakaguchi et al.

(10) Patent No.: US 6,703,146 B1
(45) Date of Patent: Mar. 9, 2004

(54) ORGANIC ELECTROLUMINESCENT DEVICE AND PANEL THEREWITH

(75) Inventors: Yoshikazu Sakaguchi, Tokyo (JP); Kenji Mori, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/660,680

(22) Filed: Sep. 13, 2000

(30) Foreign Application Priority Data

Sep. 14, 1999 (JP) .......................................... 10-261209

(51) Int. Cl.⁷ .......................... C09K 11/06; H05B 33/22
(52) U.S. Cl. ...................... 428/690; 428/917; 313/502; 313/504; 313/506
(58) Field of Search ............................... 428/690, 917; 313/502, 503, 506

(56) References Cited

U.S. PATENT DOCUMENTS

| | | | |
|---|---|---|---|
| 5,684,365 A | * 11/1997 | Tang et al. | 315/169.3 |
| 5,817,431 A | * 10/1998 | Shi et al. | 428/690 |
| 5,891,554 A | * 4/1999 | Hosokawa et al. | 428/212 |
| 6,084,347 A | * 7/2000 | Xu et al. | 313/503 |
| 6,215,244 B1 | * 4/2001 | Kuribayashi et al. | 313/505 |
| 6,224,966 B1 | * 5/2001 | Sakai et al. | 428/212 |

FOREIGN PATENT DOCUMENTS

| | | |
|---|---|---|
| JP | 02-195683 | 8/1990 |
| JP | 02-247278 | 10/1990 |
| JP | 5-295359 | 11/1993 |
| JP | 05-326146 | 12/1993 |
| JP | 6-132080 | 5/1994 |
| JP | 06-207170 | 7/1994 |
| JP | 7-53955 | 2/1995 |
| JP | 07-133483 | 5/1995 |
| JP | 7-272854 | 10/1995 |
| JP | 7-288184 | 10/1995 |
| JP | 7-119407 | 12/1995 |
| JP | 08-003147 | 1/1996 |
| JP | 8-48656 | 2/1996 |
| JP | 2554771 | 8/1996 |
| JP | 8-199162 | 8/1996 |
| JP | 8-286033 | 11/1996 |
| JP | 8333283 | 12/1996 |
| JP | 8-333569 | 12/1996 |
| JP | 08-333569 | 12/1996 |
| JP | 2686418 | 8/1997 |
| JP | 10-88121 | 4/1998 |
| JP | 10-088121 | 4/1998 |
| JP | 2795932 | 6/1998 |
| JP | 11-074079 | 3/1999 |

OTHER PUBLICATIONS

Toshio et al., Apr. 1998, JP 10–088121 Patent Abstract of Japan and computer generated English translation.*
Appl. Phys. Lett 51 (12), Sept. 12, 1997, 1987 American Institute of Physics, "Organic electroluminescent diodes".
Chishio et al., Aug. 1996, JP 08–199162 Patent Abstract of Japan and computer generated English translation.*
"New Development of Blue Organic Electroluminescence Improvement of Heat Resistance" by Hisayuki Kawamura, et al. 28th Polymer Complex Research Conference Presentation Nov. 1997.

* cited by examiner

Primary Examiner—Cynthia H. Kelly
Assistant Examiner—Dawn Garrett
(74) Attorney, Agent, or Firm—Katten Muchin Zavis Rosenman

(57) ABSTRACT

A blue organic EL device with an improved EL luminescence efficiency where an energy barrier is reduced during injection of holes or electrons from an anode or cathode to facilitate charge injection; a charge transporting layer acts as a blocking layer preventing holes or electrons from passing through a luminescent layer; and a recombination of holes and electrons is effectively performed. An organic electroluminescent device have at least two organic-compound layers selected from the group consisting of a luminescent layer emitting a blue light, an electron injection layer and an electron transporting layer between heteropolar electrodes, wherein the electron injection or electron transporting layer has an ionization potential higher than that of the luminescent layer.

32 Claims, 3 Drawing Sheets

ENERGY DIAGRAM (eV)

ENERGY DIAGRAM (eV)

ORGANIC ELECTROLUMINESCENT DEVICE AND PANEL THEREWITH

BACKGROUND OF THE INVENTION

This invention relates to an organic electroluminescent device and a panel therewith.

1. Description of the Related Art

An organic electroluminescent device (hereinafter, referred to as an organic EL device) is promising for its use as a self-light emitting type of flat-displaying device. An organic EL device is, unlike an inorganic EL device, which requires to be driven by alternating current and a higher voltage, and may be driven by DC and a lower voltage, and may be easily multicolored because a variety of organic compounds can be used.

Thus, it has been intensely studied in expectation of its application to, e.g., a color display.

When an organic EL device is applied to a color display, it is necessary to provide emission of three primary colors for light, i.e., red, green and blue colors.

Among these, there have been reported a number of examples of green emission. For example, known green devices include those using tris(8-quinolinol)aluminum (Applied Physics Letters 51, p.913 (1987)) or a diaryl amine derivative (Japanese Patent No. 2,686,418).

For an organic EL device emitting red light, for example, Japanese Patent No. 2,795,932 describes an organic EL device where a blue light is subject to wavelength conversion in a fluorochrome layer, while Japanese Patent Laid-Open Nos. HEI 07-272854, HEI 07-288184 and HEI 08-286033 have described an organic EL device emitting red light where a red fluorochrome is doped in a luminescent layer emitting a green or blue light.

For a blue luminescent device, there have been described many types of devices; for example, those using a stilbene compound (Japanese Patent Laid-Open No. HEI 05-295359), a triaryl amine derivative (Japanese Patent Laid-Open No. HEI 07-53955), a tetraaryl diamine derivative (Japanese Patent Laid-Open No. HEI 08-48656) and a styrylated biphenyl compound (Japanese Patent Laid-Open No. HEI 06-132080).

A blue luminescent material itself, however, has a larger energy gap (an energy difference between HOMO and LUMO levels) than a red or green luminescent material and thus has a higher ionization potential than an electron-transporting layer made of, for example, an 8-hydroxyquinoline metal complex such as tris(8-quinolinol)aluminum and bis(8-quinolinol) magnesium or an oxadiazole derivative, which are usually used in an organic electroluminescent device. Therefore, as shown in FIG. 4, the electron-transporting layer has poor hole-blocking property, so that holes may pass through the layer, leading to reduction in a hole-electron recombination efficiency. As a result, there have been problems such as a lower EL luminescence efficiency, a reduced maximum brightness and shift in a luminescent site.

Meanwhile, an organic EL device is, unlike an electric field-excitation luminescence type of inorganic EL device, a carrier injection type of device which emits a light by injecting hole carriers and electron carriers from an anode and a cathode, respectively, to recombine these carriers. For achieving such performance improvement in an organic EL device, it is believed that a laminate device in which a luminescent layer is combined with a charge transporting layer is more desirable than a monolayer device consisting of a luminescent layer alone. It is because an appropriate combination of a luminescent and a charge transporting materials in a multilayered device allows an energy barrier to be lowered during hole injection from an anode or electron injection from a cathode to facilitate charge injection as well as the charge transporting layer acts as a blocking layer inhibiting transmission of holes or electrons through the luminescent layer. It may improve a numerical balance between holes and electrons in the luminescent layer, resulting in efficient recombination and thus improvement in an EL luminescence efficiency. It is, therefore, a key for preparing a highly-effective organic EL device to improve hole or electron blocking property in an interface between the luminescent and the charge transporting layers.

For a red or green luminescent layer with hole transporting property, an energy gap of a luminescent material is relatively smaller. There are, therefore, many materials to be an electron transporting material with an ionization potential higher than the luminescent material. However, in a conventional blue organic EL device, a blue luminescent material has a larger energy gap as described above and it is difficult to select an electron transporting material which exhibits good deposition property and film-quality stability. As shown in FIG. 4, tris(8-quinolinol)aluminum (Alq3) is commonly used as an electron transporting or green luminescent material as an example.

This material exhibits good carrier transporting and deposition properties, but has an ionization potential of 5.67 eV, which is lower than that of a hole-transporting blue luminescent material, 5.7 to 5.8 eV. It, therefore, exhibits less hole-blocking property to a hole-transporting blue luminescent material, so that holes may pass through the material, leading to reduction in a recombination efficiency and an EL luminescence efficiency.

SUMMARY OF THE INVENTION

An objective of this invention is to ameliorate the problems in the above organic EL blue device, particularly to improve brightness and efficiency in a blue device within a range of BLUE, GREENISH BLUE and PURPLISH BLUE where an X,Y coordinate is below (0.25, 0.25) in the C.I.E. chromaticity diagram (1931).

In accordance with a first aspect of the present invention, there is provided an organic electroluminescent device comprising at least two organic-compound layers selected from the group consisting of a luminescent layer emitting a blue light, an electron injection layer and an electron transporting layer between heteropolar electrodes, wherein the electron injection or electron transporting layer has an ionization potential higher than that of the luminescent layer.

In accordance with a second aspect of the present invention, in the first aspect, the luminescent layer has hole transporting property.

In accordance with a third aspect of the present invention, in the first or second aspect, the electron injection or electron transporting layer comprises a compound represented by a general formula (1):

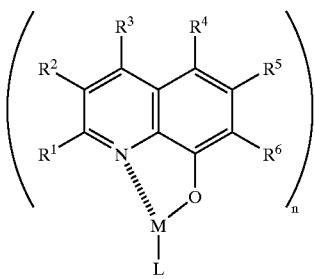

(1)

where M represents a metal atom; $R^1$ to $R^6$, which may be different or the same, are a group independently selected from the group consisting of hydrogen atom, or halogen, and alkyl, alkoxy, and cyano group; L represents a ligand having a group selected from the group consisting of halogen and substituted or unsubstituted alkoxy, aryloxy, and alkyl; and n represents 1 or 2, provided that when n is 2, groups represented by the same symbol among $R^1$ to $R^6$ may be different or the same.

In accordance with a fourth aspect of the present invention, in any one of first to third aspects, the luminescent layer comprises a compound represented by a general formula (2) or (3):

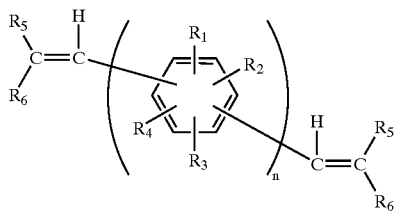

(2)

where $R_1$ to $R_4$ independently represent hydrogenatom, alkyl, alkoxy, aryl, aryloxy, amino, or cyano; and when n is more than one, groups represented by the same symbol among $R_1$ to $R_4$ on different rings may be different or the same; $R_5$ and $R_6$ independently represent an optionally substituted aryl with 6 to 12 carbon atoms; and n is an integer of 3 to 6;

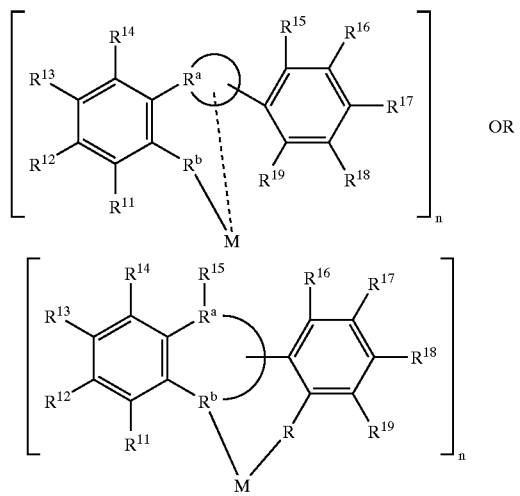

(3)

where M represents a metal atom; $R^{11}$ to $R^{19}$, which may be different or the same, independently represent a group selected from the group consisting of hydrogen, halogen, alkyl, alkoxy, aryl, and aryloxy; $R^{11}$ to $R^{14}$ or $R^{15}$ to $R^{19}$ may be combined together to form a saturated or unsaturated ring; $R^a$ is a group which may be substituted as in $R^{11}$ to $R^{19}$, $R^b$ is a hetero atom, and $R^a$ and $R^b$ may be independently or mutually combined to form a hetero ring; n represents 2 or 3; and R represents a divalent group.

In the present invention, it is preferred that the luminescent layer has an ionization potential of less than 5.9 eV.

In the present invention, it is preferred that the electron transporting layer has an ionization potential of 5.9 eV or more.

In the present invention, it is preferred that the electron transporting layer has an ionization potential at least 0.1 eV higher than that of the luminescent layer.

In the present invention, it is preferred that the electron transporting layer has a glass-transition temperature of 80° C. or higher.

In accordance with another aspect of the present invention, there is provided a panel comprising the organic electroluminescent device in any one of the first to eighth aspects.

BRIEF DESCRIPTION OF THE DRAWINGS

The objects and features of the present invention will become more apparent from the consideration of the following detailed description taken in conjunction with the accompanying drawings, in which.

DESCRIPTION OF THE PREFERRED EMBODIMENTS

Figure 5:
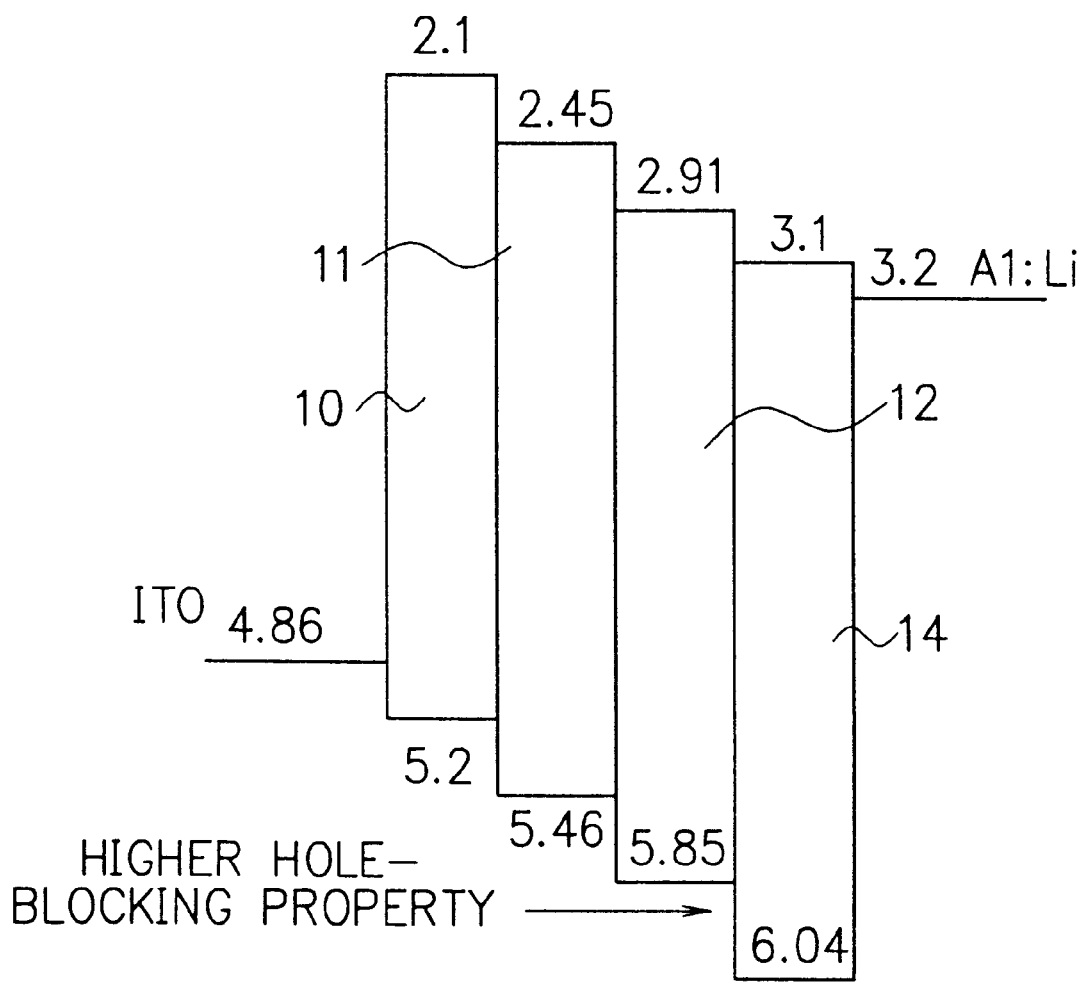
FIG. 5 is a schematic energy diagram for materials used in a conventional organic EL device according to this invention.

Table 6 and FIG. 5 show that a gallium metal complex used in this invention has a larger ionization potential of 5.9 to 6. 1 eV and exhibits quite good carrier transportation property, deposition property and film thermal stability.

In organic EL device according to this invention comprising the above materials and having the above device structure, holes injected from an anode are reliably blocked by an electron transporting layer while electrons injected from a cathode are blocked by a luminescent layer, to improve a carrier recombination efficiency. Thus, even for a blue luminescent device, a luminescence efficiency is not reduced in an organic EL luminescent device according to this invention, and the organic EL device according to this invention may have a maximum brightness larger than that in an organic EL device employing conventional Alq3.

In an organic EL device according to this invention, holes do not pass through the device and an electrical power is significantly improved in comparison with a conventional device, leading to reduction in power consumption. Furthermore, an organic EL device according to this invention ay operate under low load conditions and a device life may be, therefore, extended.

An electron transporting layer with an ionization potential of 5.9 eV or more may increase an energy gap in a blue luminescence layer.

An organic EL device according to this invention can reduce an emission wavelength. Thus, an organic EL device with good blue chromaticity which cannot be achieved with conventional materials can be prepared and a variety of chromaticities can be provided by combining such an organic EL device with a conventional organic EL device.

Figure 1:
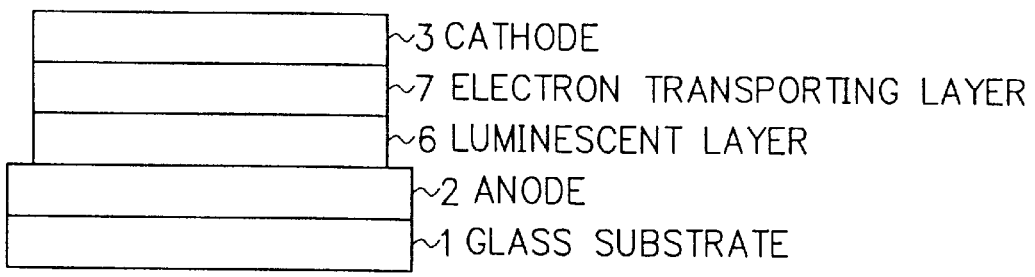
FIG. 1 shows the first embodiment of a configuration for an organic EL device according to the present invention.
Figure 2:
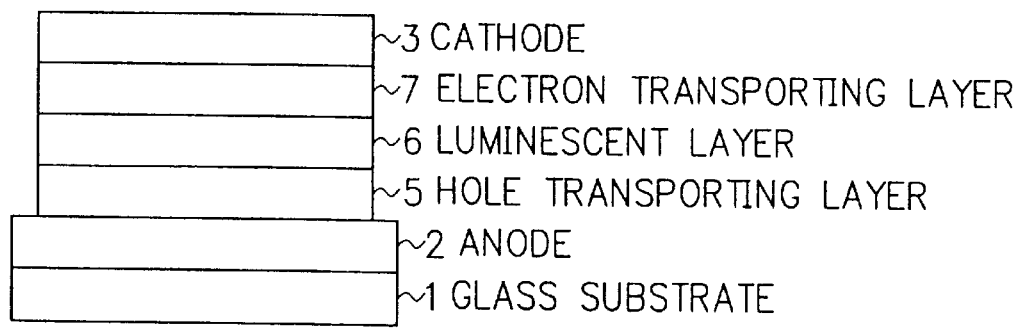
FIG. 2 shows the first embodiment of a configuration for an organic EL device according to the present invention.
Figure 3:
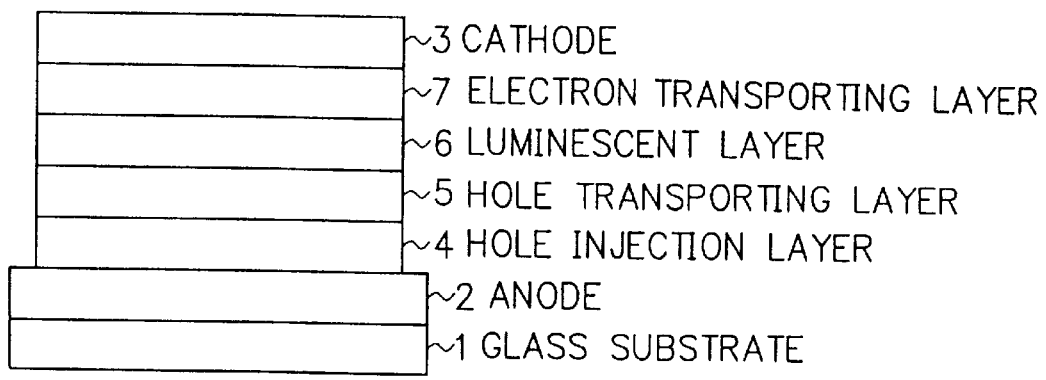
FIG. 3 shows the first embodiment of a configuration for an organic EL device according to the present invention.
Figure 4:
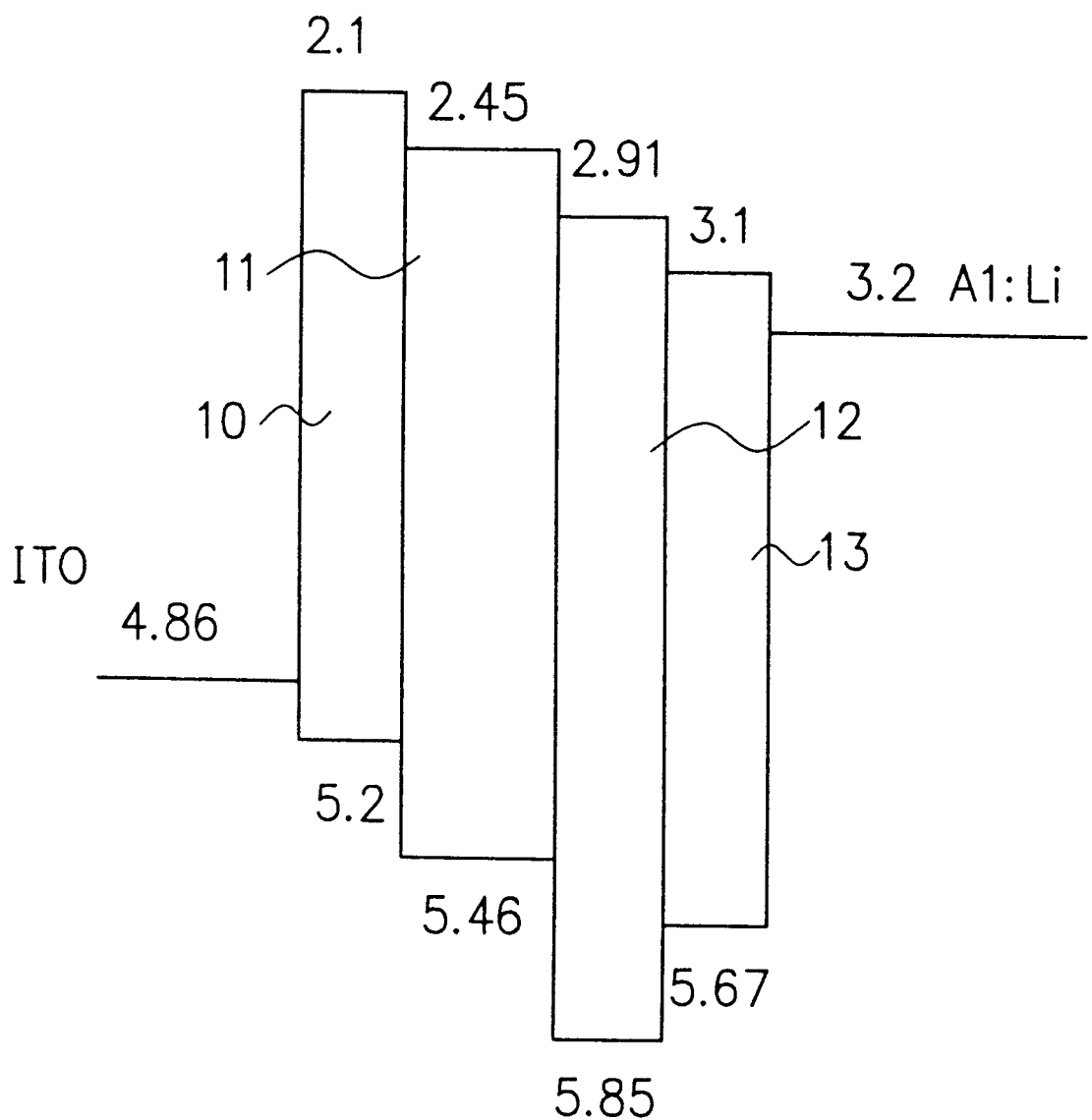
FIG. 4 is a schematic energy diagram for materials used in an organic EL device according to the prior art.

An organic EL device according to this invention has a structure where there are at least two organic films between an anode and a cathode. These layers may be, for example, combined as follows:

(1) an anode, a luminescent layer, an electron transporting layer and a cathode (see FIG. 1);

(2) an anode, a hole transporting layer, a luminescent layer, an electron transporting layer and a cathode (see FIG. 2); and (3) an anode, a hole injection layer, a hole transporting layer, a luminescent layer, an electron transporting layer and a cathode (see FIG. 3).

An organic EL device according to this invention has one of the above configurations.

An anode used in an organic EL device according to this invention is responsible for injecting holes into a hole transporting layer. It is effective that the anode has an ionization potential or work function of 4.5 eV or more. Specific materials which may be used as an anode in this invention include indium-tin-oxide (ITO), tin oxide (NESA), gold, silver, platinum and copper.

Hole injecting materials which may form a hole injection layer in an organic EL device according to this invention include, but not limited to, a metallo- or nonmetallo-phthalocyanine represented by Formula (4);

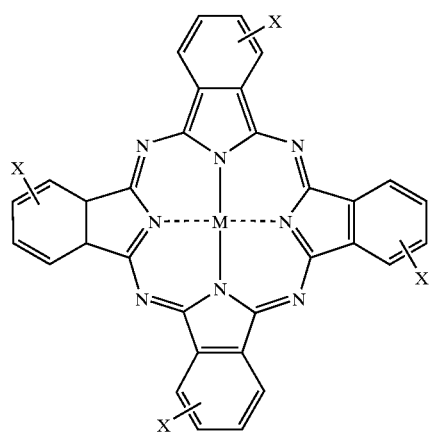

(4)

where X is hydrogen and M is at least one selected from the group consisting of Cu, VO, TiO, Mg and $H_2$; and an aryl amine compound represented by any of the following formulas:

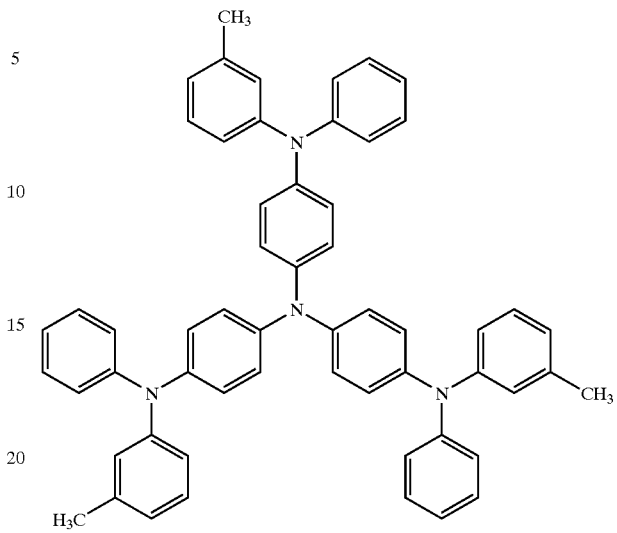

(5)

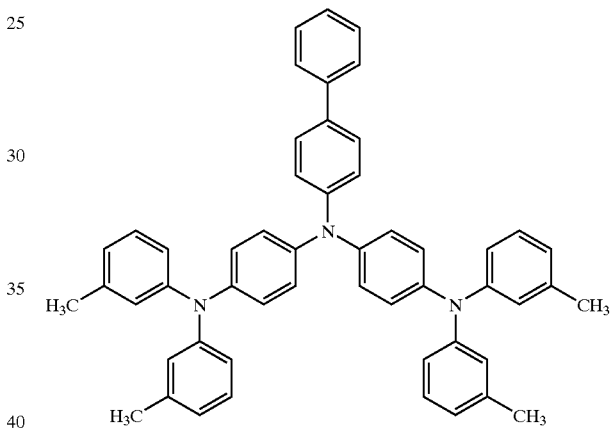

(6)

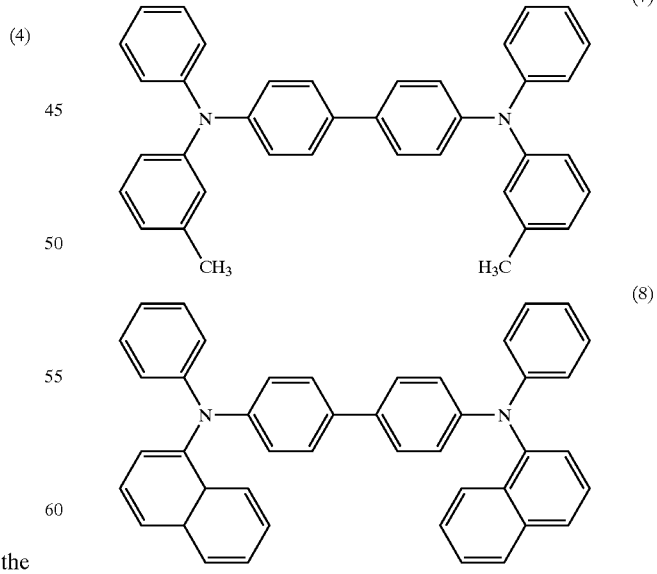

(7)

(8)

and N,N'-diphenyl-N,N'-bis(α-naphthyl)-1,1'-biphenyl-4,4'-diamine (referred to as α-NPD).

There are no limitations to a hole transporting material for forming a hole transporting layer used in an organic EL device according to this invention. Such a material may be any of compounds which can be usually used as a hole transporting material, and any material may be used as long as it can be used as such a material.

Examples of such a hole transporting material include a diamine compound represented by Formula (9);

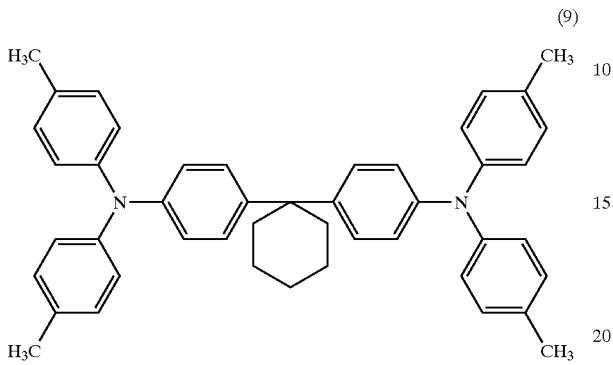

(9)

bis(di(p-tolyl)aminophenyl)-1,1-cyclohexane; N,N'-diphenyl-N,N'-bis(3-methylphenyl)-1,1'-biphenyl-4,4'-diamine; and N,N'-diphenyl-N,N'-bis(α-naphthyl)-(1,1'-biphenyl)-4,4'-diamine, as well as triamines, tetraamines and star-burst molecules.

A cathode of an organic EL device according to this invention may be preferably made of a material with a smaller work function than an anode, for effectively injecting electrons into an electron transporting layer. Specific materials which may be used as a cathode include, but not limited to, elements such as indium, aluminum and magnesium; alloys such as magnesium-indium, magnesium-aluminum, aluminum-lithium and magnesium-silver; and metal mixtures or alloys consisting of one or more of the above elements and the above alloys. Materials for an electron injection layer or electron transporting layer A material for an electron injection layer or electron transporting layer used in an organic EL device according to this invention comprises at least one of compounds represented by general formula (1):

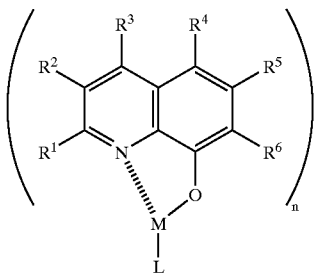

(1)

Examples of a compound represented by general formula (1) include organic metal complexes disclosed in Japanese Patent Laid-Open No. HEI 10-88121; specifically, bis(2-methyl-8-quinolinol)chlorogallium (Compound No. 116 in Table 1);

bis(2-methyl-8-quinolinol)methoxygallium (Compound No. 101 in Table 1);

bis(2-methyl-8-quinolinol)ethoxygallium (Compound No. 102 in Table 1);

bis(2-methyl-8-quinolinol)(o-cresolate)gallium (Compound No. 104 in Table 1);

bis(2-methyl-8-quinolinol)(m-cresolate)gallium (Compound No. 105 in Table 1);

bis(2-methyl-8-quinolinol)(p-cresolate)gallium (Compound No. 106 in Table 1);

bis(2-methyl-8-quinolinol)(1-phenolate)gallium (Formula (12) and Compound No. 103 in Table 1);

bis(2-methyl-8-quinolinol)(o-phenylphenolate)gallium (Compound No. 115 in Table 1);

bis(2-methyl-8-quinolinol)(m-phenylphenolate)gallium (Compound No. 114 in Table 1);

bis(2-methyl-8-quinolinol)(p-phenylphenolate)gallium (Compound No. 113 in Table 1);

bis(2-methyl-8-quinolinol)(1-naphtholate)gallium (Compound No. 111 in Table 1); and bis(2-methyl-8-quinolinol)(2-naphtholate)gallium (Compound No. 112 in Table 1) can be used.

TABLE 1

| SUBSTANCE No. | n | M | $R^1$ | $R^2 \sim R^4$ | L |
|---|---|---|---|---|---|
| 101 | 2 | Ga | —$CH_3$ | H | —$OCH_3$ |
| 102 | 2 | Ga | —$CH_3$ | H | —$OC_2H_5$ |
| 103 | 2 | Ga | —$CH_3$ | H | —O—C₆H₅ (phenolate) |
| 104 | 2 | Ga | —$CH_3$ | H | —O—(o-cresolate) |
| 105 | 2 | Ga | —$CH_3$ | H | —O—(m-cresolate) |

TABLE 1-continued
| SUBSTANCE No. | n | M | R¹ | R²~R⁴ | L |
|---|---|---|---|---|---|
| 106 | 2 | Ga | —CH₃ | H | 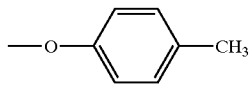 |
| 107 | 2 | Ga | —CH₃ | H | 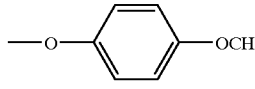 |
| 108 | 2 | Ga | —CH₃ | H | 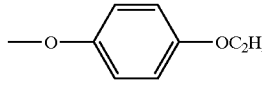 |
| 109 | 2 | Ga | —CH₃ | H | 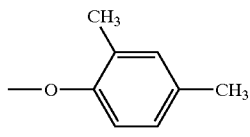 |
| 110 | 2 | Ga | —CH₃ | H | 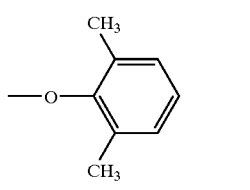 |
| 111 | 2 | Ga | —CH₃ | H | 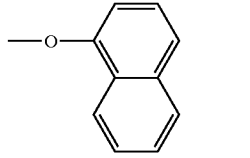 |
| 112 | 2 | Ga | —CH₃ | H | 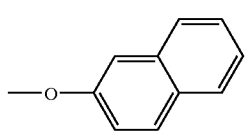 |
| 113 | 2 | Ga | —CH₃ | H | 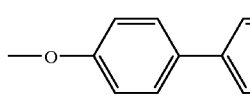 |
| 114 | 2 | Ga | —CH₃ | H | 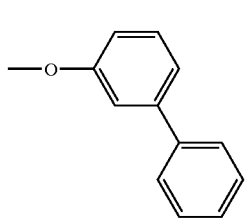 |
| 115 | 2 | Ga | —CH₃ | H | 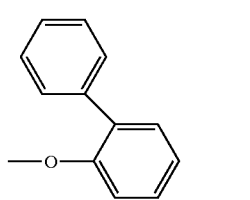 |
| 116 | 2 | Ga | —CH₃ | H | —Cl |

Such materials may be used alone or in combination of two or more, to form the above electron injection layer or electron transporting layer in an organic EL device according to this invention with a mono-, mixed- or multi-layer structure. Among the above materials used for an electron transporting layer, it is preferable in this invention to select a material with a Tg of higher than 80° C., more preferably higher than 85° C. as determined with a DSC (differential scanning calorimeter). Materials for a luminescent layer.

There are no limitations to a material used in a luminescent layer in an organic EL device according to this invention, except that its ionization potential should be lower than that of an electron transporting layer. Thus, any material usually used as a blue luminescent material may be used, but it is desirable that one or more of compounds represented by general formulas (2) or (3).

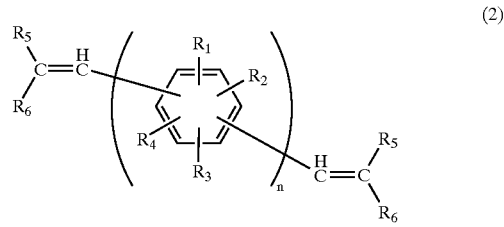

(2)

where $R_1$ to $R_4$ are independently hydrogen atom, or alkyl, alkoxy, aryl, aryloxy, amino, and cyano group; when n is two or more, groups being representative by the same symbol among $R_1$ to $R_4$ on different rings may be the same or different; $R_5$ and $R_6$ are independently optionally substituted aryl with 6 to 12 carbon atoms; and n is an integer of 3 to 6. Specific compounds are shown in Table 2.

TABLE 2

| SUBSTANCE No. | n | GROUP OF [ ] n SCRIPT IN GENERAL FORMULA(2) | $R_5$ | $R_6$ |
|---|---|---|---|---|
| 201 | 3 | —(C6H4)—(C6H4)—(C6H4)— | phenyl | phenyl |
| 202 | 4 | —(C6H4)—(C6H4)—(C6H4)—(C6H4)— | phenyl | phenyl |
| 203 | 3 | phenyl–anthracene–phenyl | phenyl | phenyl |
| 204 | 3 | (3-methoxyphenyl)–anthracene–(2-methylphenyl) | phenyl | phenyl |
| 205 | 3 | naphthyl–phenyl–naphthyl | phenyl | phenyl |

TABLE 2-continued

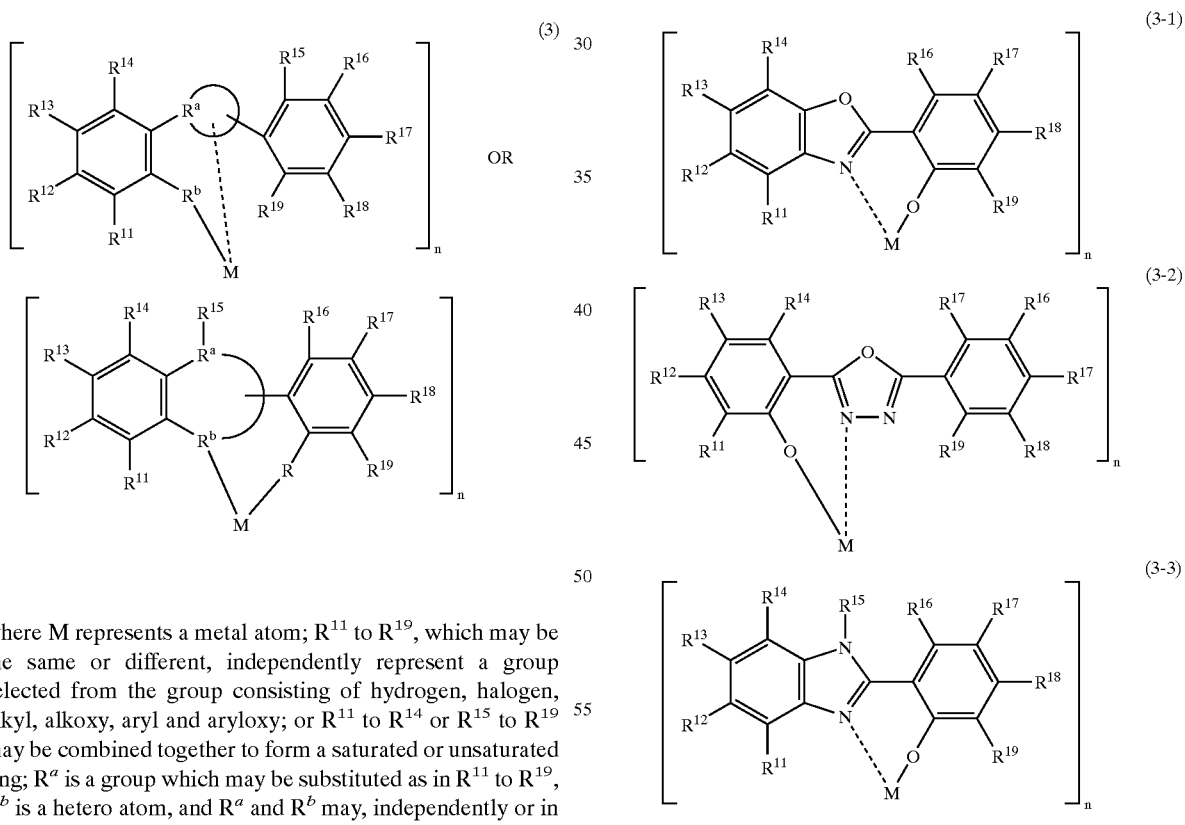

where M represents a metal atom; $R^{11}$ to $R^{19}$, which may be the same or different, independently represent a group selected from the group consisting of hydrogen, halogen, alkyl, alkoxy, aryl and aryloxy; or $R^{11}$ to $R^{14}$ or $R^{15}$ to $R^{19}$ may be combined together to form a saturated or unsaturated ring; $R^a$ is a group which may be substituted as in $R^{11}$ to $R^{19}$, $R^b$ is a hetero atom, and $R^a$ and $R^b$ may, independently or in combination, form a hetero cyclic ring; n represents 2 or 3; and R is a divalent radical, e.g., —O—.

Specific structures of such a compound having a 5-membered ring containing a plurality of hetero atoms represented by Formula (3) are represented by Formulas (3-1) to (3-3).

In these formulas, M, $R^{11}$ to $R^{19}$ and n are as defined in Formula (3).

Examples of benzoxazole, oxadiazole and imidazole compounds represented by Formulas (3-1), (3-2) and (3-3), respectively, are shown in Table 3. Unless otherwise indicated, the compounds shown in Table 3 contain all compounds represented by Formulas (3-1) to (3-3).

Specifically, for Compound No. 301 in Table 3, a compound corresponding to Formula (3-1) is a compound of Formula (16) described later; a compound corresponding to Formula (3-2) is Zn(IMZ)$_2$ described later; and a compound corresponding to Formula (3-3) is Zn(OXD)$_2$ described later.

perylene derivative represented by Formula (11), (12) or (13) as a guest.

TABLE 3

| SUBSTANCE No. | n | M | $R^{11} \sim R^{19}$ | | | REMARKS |
|---|---|---|---|---|---|---|
| 301 | 2 | Zn | $R^{11} \sim R^{19}$ = H | | | |
| 302 | 2 | Zn | $R^{11} \sim R^{12}$ = H | $R^{13}$ = CH$_3$ | $R^{14} \sim R^{19}$ = H | |
| 303 | 2 | Zn | $R^{11} \sim R^{12}$ = H | $R^{17}$ = —⟨phenyl⟩ | $R^{18} \sim R^{19}$ = H | |
| 304 | 2 | Zn | $R^{11} \sim R^{14}$ = H | $R^{15} \sim R^{16}$ = —⟨phenyl⟩ | $R^{18} \sim R^{19}$ = H | |
| 305 | 3 | Al | $R^{11} \sim R^{19}$ = H | | | |
| 306 | 3 | Al | $R^{11} \sim R^{16}$ = H | $R^{17}$ = —⟨phenyl⟩ | $R^{18} \sim R^{19}$ = H | |
| 307 | 2 | Zn | $R^{11} \sim R^{14}$ = H OR $R^{11} \sim R^{15}$ | $R^{15}$ = OR $R^{16}$ —⟨phenyl⟩ | $R^{18} \sim R^{19}$ = H OR $R^{17} \sim R^{19}$ | (3-1) (3-2) (3-3) OR |
| 308 | 2 | Zn | $R^{15}$ —CH$_3$ OR $R^{16}$ | H OTHER THAN (3-1) | | (3-2) OR (3-3) |

The above compound as a host may be doped with, for example, an amino-substituted distyrylarylene derivative or

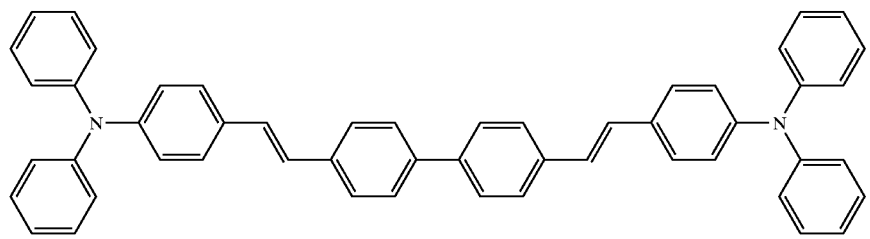

(10)

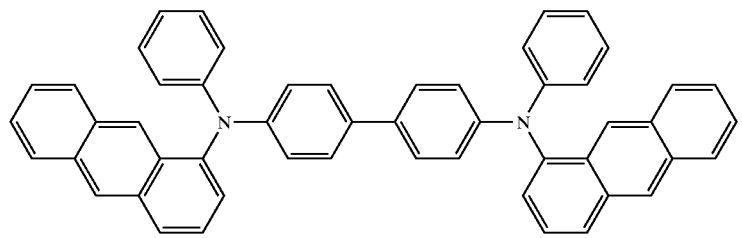

(11)

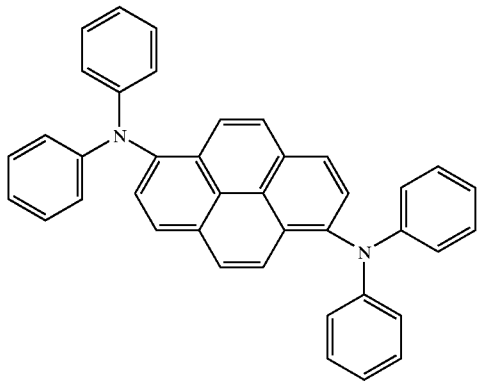

Examples of a compound represented by general formula (2) include those disclosed in Japanese Patent Publication No. HEI 07-119407, Japanese Patent No. 2,554771, Japanese Patent Laid-Open No. HEI 08-199162, Japanese Patent Laid-Open No. HEI 08-333569 and Japanese Patent Laid-Open No. HEI 08-333283, including the following compounds:

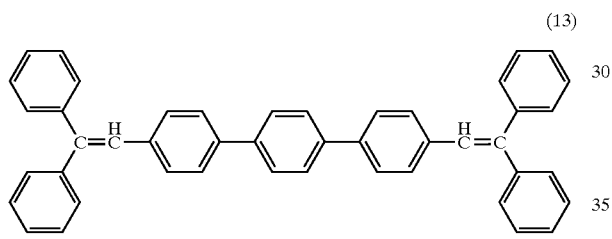

4,4"-bis(2,2-diphenylvinyl)p-terphenyl (Formula (13));
4,4'''-bis(2,2-diphenylvinyl)-p-quarterphenyl;

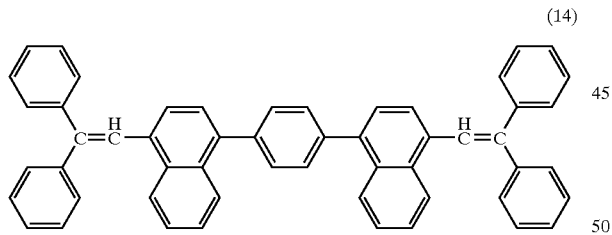

1,4-bis[4-(2,2-diphenylvinyl)naphthyl]benzene (Formula (14));

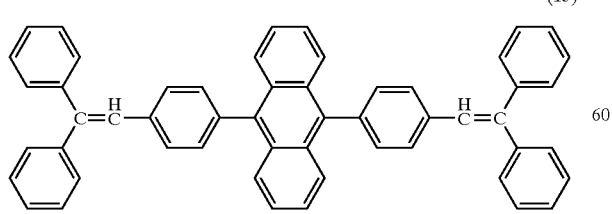

9,10-bis[4-(2,2-diphenylvinyl)phenyl]anthracene (Formula (15); Compound No. 203 in Table 5);

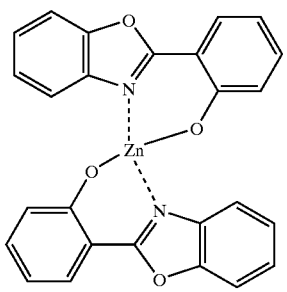

bis[2-m-phenoxybenzoxazole]zinc[Zn(OXZ)$_2$] (Formula (16));
bis[(2-m-phenoxy-3-phenyl)benzimidazole]zinc (Zn (IMZ)$_2$); and

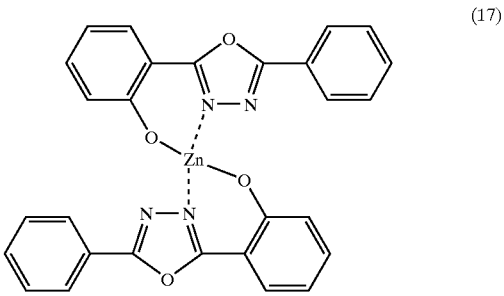

bis[(2-phenyl-6-m-phenoxy)-1,3,4-oxadiazole]zinc (Zn (OXD)$_2$) (Formula (17)).
Tris[(2-phenyl-5-m-phenoxy)-1,3,4-oxadiazole] aluminum (Al(OXD)$_3$) (represented by Formula (3-2); one of Compound No. 305 in Table 3) is also included.

There will be described a process for preparing an organic EL device according to this invention.

There are no limitations to a process for forming each layer in an organic EL device according to this invention. An organic film used in an organic EL device according to this invention may be formed by a well-known process such as vacuum deposition, molecular beam deposition and application methods. In terms of the application method, the film may be formed by, for example, dipping, spin coating or casting, using a solution or dispersion.

Each layer may be formed with the above configuration by any of the above-described process to form an organic EL device according to this invention.

There are no limitations to a film thickness of each organic layer in an organic EL device according to this invention. However, an excessively thin film generally tends to generate defects such as a pin hole, while an excessively thick film requires a higher applied voltage, leading to reduction in efficiency. Thus, it is preferable to form each organic layer with a thickness of, for example, several nm to 1 μm.

An electron transporting material represented by the general formula (1) according to this invention may be prepared by a known process using a gallium compound and a compound having a ligand residue of Formula (1) represented by Formula (18) as starting materials.

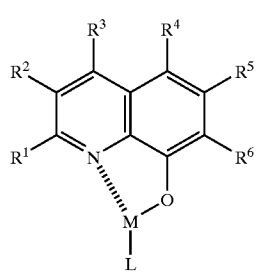

(18)

Examples of the gallium compound include, but not limited to, ionic gallium compounds such as alkylgalliums, gallium alkoxides, gallium halides, gallium nitride and gallium oxide. There may be two quinoline residues represented by the general formula (18) such as 8-hydroxyquinoline and 2-methyl-8-hydroxyquinoline residues. A ligand L may be halogen such as fluorine, chlorine, bromine and iodine; optionally substituted alkoxy; optionally substituted aryloxy; and optionally substituted alkyl, and the compound may contain only one of these ligands. Such a complex represented by general formula (1), ligand represented by general formula (18) or ligand L may be prepared by a reaction in a solvent such as polar organic solvents including ionic solvents e.g., alcohols (e.g., methanol and ethanol); or nonpolar solvents including aromatic solvents, e.g., benzene and toluene and alicyclic solvents, e.g., tetrahydrofuran.

A luminescent material represented by the general formula (2) used in this invention may be prepared by a well-known process. For example, a phosphonate containing a phenyl group may be treated with a base for deprotonation in the presence of a solvent as described above and then alkenylated by adding a carbonyl compound such as benzophenone (e.g., Wittig reaction). Alternatively, a phosphonate may be treated with a base for deprotonation and then reacted with a dialdehyde containing a phenyl group (a reaction as described above; e.g., Wittig reaction). Examples of the base include alkyl alkali-metal salts such as alkyl lithium; alkali-metal hydrides such as lithium aluminum hydride and sodium hydride; sodium amide; and sodium hydroxide.

A luminescent material represented by the general formula (3), (4) or (5) used in this invention may be prepared by a known process. For example, benzoyl chloride and benzoyl hydrazide are reacted in the presence of dioxane to provide a diacyl hydrazide. The product is then dehydrated and reduced to provide an oxadiazole structure. After deprotection, a compound containing an oxadiazole residue obtained is reacted with a zinc compound such as zinc acetate in the presence of a polar solvent such as methanol, ethanol and isopropyl alcohol or a non-polar solvent such as n-hexane, to provide an oxadiazole-zinc complex.

EXAMPLES

This invention will be described in detail with reference to, but not limited to, examples.

Ionization Potential

An ionization potential was determined using AC-1 (Riken Keiki Co., Ltd.) at 24° C. and 40% RH under an atmospheric pressure for a sample prepared by depositing each material of interest on a glass substrate. Deposition was conducted as described in later deposition. Tg (glass-transition temperature)

For a material for an electron transporting layer, Tg was determined with DSC-50 (Shimadzu Corporation).

Example 1

FIG. 1 shows a cross section of an organic EL device of Example 1. The organic EL device of Example 1 consists of a transparent substrate (glass substrate) 1, an anode 2 and a cathode 3 on the glass substrate 1, organic films 6 and 7 sandwiched between the anode 2 and the cathode 3. A preparation procedure for the organic EL device of Example 1 will be described. On a glass substrate was deposited by sputtering ITO (indium tin oxide) as an anode 2 to a thickness of 1300 A (130 nm), where a sheet resistance was 12Ω/□. The ITO glass substrate thus prepared was subject to ultrasonic cleaning with purified water and isopropyl alcohol in sequence, and then dried over a boiling isopropyl alcohol. The substrate was washed by a UV-ozone cleaner and then placed on a substrate holder in a vacuum evaporator.

On two molybdenum boats were placed 100 mg of 4,4″-bis(2,2-diphenylvinyl)-p-terphenyl with an ionization potential of 5.85 eV as a luminescent layer 6 and 100 mg of bis(2-methyl-8-quinolinol)(1-phenolate)gallium with an ionization potential of 6.03 eV as an electron transporting layer 7, respectively, and then connected to separate electric terminals.

After vacuuming the vacuum chamber to $1\times10^{-4}$ Pa, a current was applied to the boat on which 4,4″-bis(2,2-diphenylvinyl)-p-terphenyl was placed, for depositing a film to a thickness of 50 nm at an evaporation rate of 0.3 nm/sec. Then, a current was applied to the boat on which bis(2-methyl-8-quinolinol)(1-phenolate)gallium was placed, for depositing a film to a thickness of 50 nm at an evaporation rate of 0.3 nm/sec.

A stainless shadow mask was placed on the device thus prepared having the structure of substrate/ITO/4,4″-bis(2,2-diphe nylvinyl)-p-terphenyl/bis(2-methyl-8-quinolinol)(1-phenolate)gallium, in which an ionization potential difference between the luminescent and the electron transporting layers was 0.18. Then, 3 g of aluminum was placed on a BN boat, which was then connected to an electric terminal. In a similar manner, 500 mg of Li was placed in a tungsten filament, which was then connected to another electric terminal. After vacuuming the vacuum chamber to $1\times10^{-4}$ Pa, a current was applied such that aluminum was deposited at a rate of 0.4 nm/sec, while applying a current with another evaporation electric source such that lithium was deposited at a rate of 0.02 to 0.03 nm/sec. When the deposition rates of both materials became stable, a shutter was opened. When the thickness of a mixed film became 30 nm, the evaporation electric source for lithium was turned off while continuing aluminum deposition to a thickness of 170 nm to form a cathode 3.

After opening the vacuum chamber to the atmosphere, an organic EL device was prepared, which consisted of a transparent substrate/ITO/4,4"-bis(2,2-diphenylvinyl)-p-terphenyl/bis(2-methyl-8-quinolinol)(1-phenolate)gallium/Al—Li/Al.

A voltage of 15 V was applied to the organic EL device in which the ITO and the aluminum electrodes are an anode and a cathode, respectively to provide blue luminescence of 6,800 cd/m$^2$ as shown in Table 1.

The device was run with an initial brightness of 100 cd/M$^2$ under a nitrogen atmosphere, and consequently a brightness half-life was 2,500 hours.

Furthermore, after storing for 3,000 hours under a nitrogen atmosphere, the device was observed for a non-luminescent area, so-called a dark spot. The dark spot was 5 μm immediately after deposition while 5 to 10 μm after storage, indicating no growth of the dark spot.

Comparative Example 1

An organic EL device in which an electron transporting layer had an ionization potential smaller by 0.21 eV than a luminescent layer, i.e., a device with low hole-blocking property, was prepared as described in Example 1, except depositing 4,4'-bis(2,2-diphenylvinyl)biphenyl represented by Formula (19) with an ionization potential of 5.89 eV to 50 nm as a luminescent layer 4 and tris(8-quinolinol) aluminum represented by Formula (20) to 50 nm as an electron transporting layer 5, by vacuum evaporation.

(19)

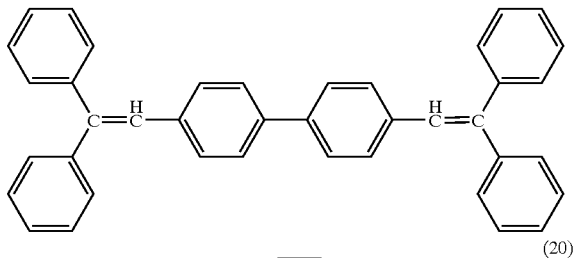

(20)

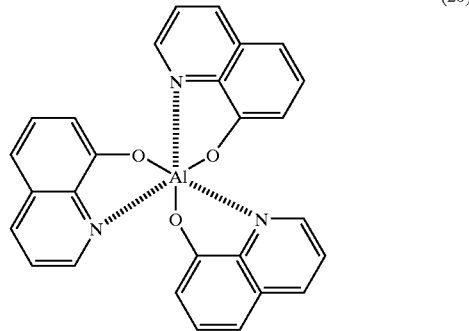

A DC voltage of 15 V was applied between the anode 2 and the cathode 3 in the organic EL device thus prepared to provide a blue luminescence of 3,600 cd/m$^2$. Compared with Example 1, as shown in Table 2, a CIE chromaticity coordinate was not significantly shifted, but a maximum brightness and an efficiency were considerably inferior. Furthermore, a brightness half-life was 900 hours, which was shorter than that in Example 1.

The device was observed for a dark spot (non-luminescent area) before and after storing it for 3,000 hours under a nitrogen atmosphere. Consequently, it was 7 μm before storing while it grew to 65 μm after storing.

Example 2

An organic EL device in which an electron transporting layer had an ionization potential larger by 0.23 eV than a luminescent layer, i.e., a device with high hole-blocking property, was prepared as described in Example 1, except depositing 4,4'''-bis(2,2-diphenylvinyl)-p-quarterphenyl with an ionization potential of 5.74 eV as a luminescent material and bis(2-methyl-8-quinolinol)(1-naphtholate)gallium with an ionization potential of 5.97 eV to 50 nm as an electron transporting material, by vacuum evaporation.

For the device, a current-application test was conducted as described in Example 1. Consequently, a blue luminescence with a maximum brightness of 8,500 cd/m$^2$ was obtained as shown in Table 4.

Comparative Example 2

An organic EL device in which an electron transporting layer had an ionization potential smaller by 0.09 eV than a luminescent layer was prepared as described in Example 2, except depositing bis{2-(4-t-butylphenyl)-1,3,4-oxadiazole}-m-phenylene represented by Formula (21) with an ionization potential of 5.65 eV to 50 nm as an electron transporting layer 5 by vacuum evaporation.

(21)

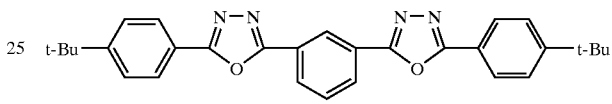

A DC voltage of 16 V was applied between the anode 2 and the cathode 3 in the organic EL device thus prepared to provide a blue luminescence of 6,500 cd/M$^2$. It was found that a CIE chromaticity coordinate was not significantly shifted, but a maximum brightness, an efficiency and a life were considerably inferior to those in Example 2.

Example 3

An organic EL device in which an electron transporting layer had an ionization potential larger by 0.34 eV than a luminescent layer, was prepared as described in Example 1, except depositing bis(2-m-phenoxy)-benzoxazole zinc (Zn(OXZ)$_2$) (compound of Formula (16); one of Compound No. 301 in Table 3 represented by Formula (3-1)) with an ionization potential of 5.68 eV to 50 nm as a luminescent layer and bis(2-methyl-8-quinolinol)(p-phenylphenolate)gallium (Compound No. 113 in Table 1; Tg (glass-transition temperature) as determined with a DSC=102° C.) with an ionization potential of 6.02 eV to 50 nm as an electron transporting layer 5, by vacuum evaporation.

A DC voltage of 17 V was applied between the anode 2 and the cathode 3 in the organic EL device thus prepared to provide a blue luminescence of 6,700 cd/m$^2$.

Comparative Example 3

An organic EL device in which an electron transporting layer had an ionization potential smaller by 0.01 eV than a luminescent layer was prepared as described in Example 3, except depositing Alq3 with an ionization potential of 5.67 eV to 50 nm as an electron transporting layer 5 by vacuum evaporation.

A DC voltage of 17 V was applied between the anode 2 and the cathode 3 in the organic EL device thus prepared to provide a blue luminescence of 5,600 cd/m$^2$. Compound with Example 3, it was found that a maximum brightness was not so different, but a CIE chromaticity coordinate (luminescent color) was significantly shifted to a longer wavelength (to green).

From an EL luminescence spectrum, it was found that both (Zn(OXZ)$_2$) and Alq3 emitted light, indicating that (Zn(OXZ)$_2$) transported holes to allow recombination of holes and electrons and generation of excitons to occur in the Alq3 layer (electron transporting layer).

For the zinc complex used in this invention, luminescence was thought to occur in the interface between the hole transporting layer—the luminescent layer. Comparative Example 3, however, showed that both hole and electron transporting properties are large in the zinc complex. Furthermore, smaller hole-blocking property in Alq3 caused recombination of holes and electrons in the Alq3 layer to generate luminescence in Alq3, leading to deterioration in a chromaticity.

As is apparent from comparison of Example 3 with Comparative Example 3, an electron transporting layer in this invention can be used to provide a pure blue luminescence even when using a zinc-metal complex as in Example 3 or Comparative Example 3, because of its hole-blocking/containment property. Thus, in this invention a maximum brightness and an efficiency were significantly improved.

Example 4

An organic EL device was prepared as described in Example 2, except depositing 1,2,3,4,5-pentaphenyl-1,3-cyclopentadiene represented by Formula (22) to 50 nm as a luminescent layer and bis(2-methyl-8-quinolinol) chlorogallium to 50 nm as an electron transporting layer 5, by vacuum evaporation.

A DC voltage of 16 V was applied between the anode 2 and the cathode 3 in the organic EL device thus prepared to provide a blue luminescence of 5,400 cd/m$^2$.

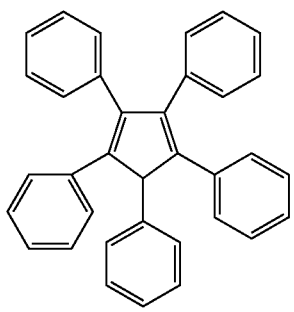

(22)

Example 5

FIG. 2 shows a cross section of an organic EL device of Example 5. The organic EL device of this example consists of a glass substrate 1, an anode 2 and a cathode 3 on the glass substrate 1, and a hole transporting layer 5, a luminescent layer 6 and an electron transporting layer 7 sandwiched between the anode 2 and the cathode 3.

To an evaporation apparatus was mounted an ITO glass substrate prepared as described in Example 1. Three high-purity graphite crucibles were prepared. In these crucibles were placed 1 g of N,N'-diphenyl-N,N'-bis(α-naphthyl)-1,1'-biphenyl-4,4'-diamine (α-NPD) as a hole transporting layer, 1 g of 4,4"-bis(2,2-diphenylvinyl)-p-terphenyl (Formula (14); Compound No. 201 in Table 2) with an ionization potential of 5.85 eV as a luminescent material, and 1 g of bis(2-methyl-8-quinolinol)(1-phenolate)gallium (Formula (12); Compound No. 103 in Table 1; Tg (glass-transition temperature) as determined with a DSC=89° C.)) represented by Formula (22) with an ionization potential of 6.03 eV as an electron transporting material, respectively, and then connected to separate electric terminals.

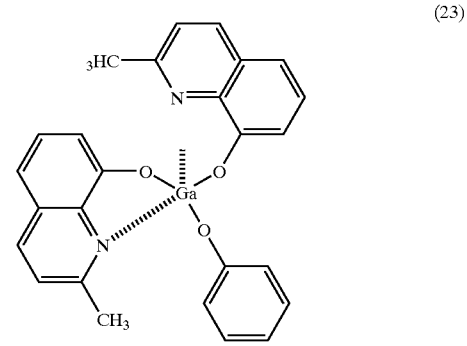

(23)

After vacuuming the vacuum chamber to 1×10$^{-4}$ Pa, a voltage was first applied to the crucible in which α-NPD was placed, for depositing a film to a thickness of 50 nm at an evaporation rate of 0.3 nm/sec. Then, a current was applied to the crucible in which 4,4"-bis(2,2-diphenylvinyl)-p-terphenyl was placed, for depositing a film to a thickness of 45 nm at an evaporation rate of 0.3 nm/sec. Finally, a current was applied to the crucible in which bis(2-methyl-8-quinolinol)(1-phenolate)gallium was placed, for depositing a film to a thickness of 50 nm at an evaporation rate of 0.3 nm/sec.

Subsequently, magnesium-silver alloy as a cathode 3 was deposited to 200 nm by vacuum evaporation on the device thus prepared having the structure of substrate/ITO/α-NPD/4,4"-bis(2,2-diphenylvinyl)-p-terphenyllbis(2-methyl-8-quinolinol) (1-phenolate)gallium to provide an organic EL device in which the electron transporting layer had an ionization potential larger by 0.18 eV than the luminescent layer.

A DC voltage of 17 V was applied between the anode 2 and the cathode 3 in the organic EL device thus prepared to provide a blue luminescence of 16,500 cd/m$^2$ as shown in Table 1.

Example 6

An organic EL device in which an electron transporting layer had an ionization potential larger by 0.35 eV than a luminescent layer, was prepared as described in Example 5, except depositing 1,4-bis[4-(2,2-diphenylvinyl)naphthyl] benzene (Formula (15); Compound No. 205 in Table 2) with an ionization potential of 5.69 eV to 45 nm as a luminescent layer and bis(2-methyl-8-quinolinol)ethoxy gallium with an ionization potential of 6.04 eV to 40 nm as an electron transporting layer 7, by vacuum evaporation.

A DC voltage of 17 V was applied between the anode 2 and the cathode 3 in the organic EL device thus prepared to provide a blue luminescence of 21,700 cd/M$^2$ as shown in Table 1.

Comparative Example 4

An organic EL device in which an electron transporting layer had an ionization potential larger by 0.18 eV than a luminescent layer, was prepared as described in Example 5, except depositing 3-(4-biphenylyl)-4-phenyl-5-(4-t-butylphenyl)-1,2,4-triazole represented by Formula (23) to 40 nm as an electron transporting layer 5, by vacuum evaporation.

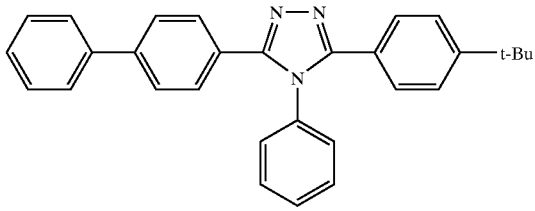

(24)

A DC voltage of 17 V was applied between the anode 2 and the cathode 3 in the organic EL device thus prepared to provide a blue luminescence of 9,400 cd/m² as shown in Table 2. It was found that as in a gallium-metal complex, the triazole derivative had a large ionization potential and had hole-blocking property, although, in comparison with the gallium-metal complex, a drive voltage was higher probably due to lower electron injection and electron transporting properties, leading to a lower electrical efficiency. Compared with Example 5, it was found that a CIE chromaticity coordinate was not so different, but a maximum brightness, an efficiency and a life were obviously inferior.

Example 7

An organic EL device in which an electron transporting layer had an ionization potential larger by 0.30 eV than a luminescent layer, was prepared as described in Example 5 except depositing bis[(2-phenyl-5-m-phenoxy)-1,3,4-oxadiazole]zinc (Zn(OXD)₂) represented by Formula (18) with an ionization potential of 5.72 eV to 45 nm as a luminescent layer 6 and bis(2-methyl-8-quinolinol)(p-phenylphenolate)gallium (Compound No. 113 in Table 1) with an ionization potential of 6.02 eV to 35 nm as an electron transporting layer 7, by vacuum evaporation.

A DC voltage of 17 V was applied between the anode 2 and the cathode 3 in the organic EL device thus prepared to provide a blue luminescence of 7,800 cd/m².

Example 8

FIG. 3 shows a cross section of an organic EL device of Example 8. The organic EL device of this example consists of a glass substrate 1, an anode 2 and a cathode 3 on the glass substrate 1, and a hole injection layer 4, a hole transporting layer 5, a luminescent layer 6 and an electron transporting layer 7 sandwiched between the anode 2 and the cathode 3.

To an evaporation apparatus was mounted an ITO glass substrate prepared as described in Example 1.

In molybdenum boats were placed 100 mg of 4-phenyl-4',4"-bis[di(3-methylphenyl)amino]triphenylamine as a hole injection layer, 100 mg of α-NPD as a hole transporting layer, 100 mg of 9,10-bis[4-(2,2-diphenylvinyl)phenyl]anthracene (Formula (16); Compound No. 203 in Table 2) with an ionization potential of 5.70 eV as a luminescent layer, and 100 mg of bis(2-methyl-8-quinolinol)(1-naphtholate)gallium (Compound No. 111 in Table 1; Tg as determined with a DSC=103° C.)) with an ionization potential of 5.97 eV as an electron transporting layer, respectively, and then connected to separate electric terminals.

After vacuuming the vacuum chamber to 1×10⁻⁴ Pa, a voltage was first applied to the boat in which 4-phenyl-4',4"-bis[di(3-methylphenyl)amino]triphenylamine was placed, for depositing a film to a thickness of 35 nm at an evaporation rate of 0.3 nm/sec. Then, a current was applied to the boat in which α-NPD was placed, for depositing a film to a thickness of 15 nm at an evaporation rate of 0.3 nm/sec. Then, a current was applied to the boat in which 9,10-bis[4-(2,2-diphenylvinyl)phenyl]anthracene was placed, for depositing a film to a thickness of 45 nm at an evaporation rate of 0.3 nm/sec. Then, a current was applied to the boat in which bis(2-methyl-8-quinolinol)(1-naphtholate)gallium was placed, for depositing a film to a thickness of 35 nm at an evaporation rate of 0.3 nm/sec. Finally, a cathode was formed to 200 nm as described in Example 1, to provide an organic EL device in which the electron transporting layer was larger by 0.27 eV than the luminescent layer.

A DC voltage of 17 V was applied between the anode and the cathode in the organic EL device thus prepared to provide a blue luminescence of 34,200 cd/m² as shown in Table 1.

The device was run with an initial brightness of 100 cd/M² under a nitrogen atmosphere, and consequently a brightness half-life was 16,000 hours. Before and after storing for 16,000 hours under a nitrogen atmosphere, the device was observed for a dark spot. The dark spot was 5 μm before storage while 5 to 7 μm after storage, i.e., there was not significant change, indicating no growth of the dark spot.

Comparative Example 5

An organic EL device was prepared as described in Example 8, except depositing 1,4-bis[4-(2,2-diphenylvinyl)naphthyl]benzene (Formula (15); Compound No. 205 in Table 5) to 45 nm as a luminescent layer and 2-(4-biphenylyl)-5-(4-t-butylphenyl)-1,3,4-oxadiazole represented by Formula (25) to 35 nm as an electron transporting layer, by vacuum evaporation.

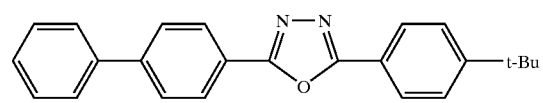

(25)

A DC voltage of 17 V was applied between the anode and the cathode in the organic EL device thus prepared to provide a blue luminescence of 13,700 cd/m² as shown in Table 2. Compared with Example 8, a CIE chromaticity coordinate was not significantly shifted, but a maximum brightness, an efficiency and a life were considerably inferior.

Example 9

FIG. 3 shows a cross section of an organic EL device of Example 9. The organic EL device of this example consists of a glass substrate 1, an anode 2 and a cathode 3 on the glass substrate 1, and a hole injection layer 4, a hole transporting layer 5, a luminescent layer 6 consisting of host and dopant and an electron transporting layer 7 sandwiched between the anode 2 and the cathode 3.

To an evaporation apparatus was mounted an ITO glass substrate prepared as described in Example 1. Five high-purity graphite crucibles were prepared. In these crucibles were placed 1 g of 4-phenyl-4',4"-bis[di(3-methylphenyl)amino]tripheylamine as a hole injection layer, 1 g of N,N'-diphenyl-N,N'-bis(α-naphthyl)-1,1'-biphenyl-4,4'-diamine (α-NPD) as a hole transporting layer, 1 g of 9,10-bis[4-(2,2-diphenylvinyl)phenyl]anthracene with an ionization potential of 5.70 eV as a luminescent host material, 0.5 g of 4,4'-bis[2-{4-(N,N-di(4-methylphenyl)amino)phenyl}vinyl]biphenyl represented by Formula (26) as a luminescent guest material and 1 g of bis(2-methyl-8-quinolinol)(1-phenolate) gallium with an ionization potential of 6.03 eV as an electron transporting material, respectively, and then connected to separate electric terminals.

Table 2. Compared with Example 9, a CIE chromaticity coordinate was not significantly different, but a maximum brightness, an efficiency and a life were considerably inferior.

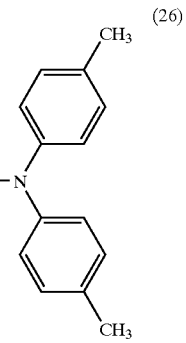
(26)

After vacuuming the vacuum chamber to $1 \times 10^{-4}$ Pa, a hole injection layer and a hole transporting layer were deposited as described in Example 8 with the same thicknesses as Example 8. First, a current was applied to the crucibles in which 9,10-bis[4-(2,2-diphenylvinyl)phenyl] anthracene as a host and 4,4'-bis[2-{4-(N,N-di(4-methylphenyl)amino)phenyl}vinyl]biphenyl as a guest were placed, for depositing the host and the guest while controlling the current to keep deposition rates at 0.3 nm/sec and 0.02 to 0.03 nm/sec, respectively. After becoming stable, both materials were simultaneously deposited to a thickness of 45 nm. Then, a current was applied to the crucible in which bis(2-methyl-8-quinolinol)(1-phenolate)gallium was placed, for depositing a film to a thickness of 35 nm at an evaporation rate of 0.3 nm.

On the device thus prepared was formed a cathode as described in Example 8 to provide an organic EL device in which an electron transporting layer had an ionization potential larger by 0.33 eV than a host molecule in a luminescent layer and a guest had a lower ionization potential than a host.

A DC voltage of 18 V was applied between the anode and the cathode in the organic EL device thus prepared to provide a blue luminescence of 39,500 cd/m² as shown in Table 1. The device was run with an initial brightness of 100 cd/m² under a nitrogen atmosphere, and consequently a brightness half-life was 20,000 hours. Before and after storing for 20,000 hours under a nitrogen atmosphere, the device was observed for a dark spot. The dark spot was 4 to 5 μm before storage while 5 to 7 μm after storage, which was not changed from that immediately after deposition, indicating no growth of the dark spot.

Comparative Example 6

An organic EL device was prepared as described in Example 9, except depositing 4,4'-bis(2,2-diphenylvinyl) biphenyl as a luminescent layer host to 45 nm and tris(8-quinolinol)aluminum as an electron transporting layer 5 to 35 nm, by vacuum evaporation. In the organic EL device thus prepared, the electron transporting layer had a smaller ionization potential by 0.21 eV than the luminescent layer.

A DC voltage of 17 V was applied between the anode and the cathode in the organic EL device thus prepared to provide a blue luminescence of 17,000 cd/m² as shown in

TABLE 4

| Example No. | CIE chromaticity coordinate | Maximum brightness (cd/m²) and applied voltage (V) | Efficiency 1 m/w (200 cd/m²) | Brightness half-life (hr) |
|---|---|---|---|---|
| 1 | (0.14, 0.10) | 6800 (15 V) | 0.8 | 2500 |
| 5 | (0.15, 0.11) | 15500 (17 V) | 2.1 | 7500 |
| 6 | (0.15, 0.16) | 21700 (17 V) | 2.5 | 8300 |
| 8 | (0.16, 0.15) | 34200 (17 V) | 4.0 | 16000 |
| 9 | (0.16, 0.17) | 39500 (17 V) | 4.8 | 20000 |

TABLE 5

| Comparative Example No. | CIE chromaticity coordinate | Maximum brightness (cd/m²) and applied voltage (V) | Efficiency 1 m/w (200 cd/m²) | Brightness half-life (hr) |
|---|---|---|---|---|
| 1 | (0.12, 0.10) | 3600 (16 V) | 0.5 | 900 |
| 2 | (0.16, 0.16) | 6500 (16 V) | 0.9 | 1500 |
| 4 | (0.14, 0.11) | 9400 (17 V) | 1.3 | 4000 |
| 5 | (0.16, 0.17) | 13700 (17 V) | 1.6 | 7500 |
| 6 | (0.15, 0.16) | 17000 (17 V) | 1.9 | 7500 |

TABLE 6

| Compound | IP (eV) |
|---|---|
| 103 | 6.03 |
| 102 | 6.04 |
| 113 | 6.02 |
| 111 | 5.97 |
| 116 | 5.95 |
| 201 | 5.85 |
| 202 | 5.74 |

TABLE 6-continued

| Compound | IP (eV) |
|---|---|
| 203 | 5.70 |
| 301 | 5.68 |
| 304 | 5.72 |
| 306 | 5.70 |

IP: ionization potential

Example 10
Fabrication of a Color Panel

On a glass substrate with a thickness of 1.1 mm was deposited by sputtering an ITO film as an anode to 130 nm, which was then patterned by lithography and wet etching to form a transparent electrode with a sheet resistance of 12Ω/□, an interconnection width of 90 μm and a space of 30 μm.

On the whole surface of the glass substrate on which the patterned anode was formed were deposited 4-phenyl-4',4"-bis[di(3-methylphenyl)amino]triphenylamine as a hole injected layer to 35 nm and α-NPD as a hole transporting layer to 15 nm by resistance heating under a vacuum of $2\times10^{-4}$ Pa.

On the film was placed a shadow mask having a line pattern (90 μm) corresponding to a luminescent area (dot) of one of three colors RGB, such that the mask almost in contact with the panel substrate was aligned on the ITO interconnection and the mask opening of the shadow mask was matched to an area to be a red luminescent area and the mask. On the substrate were deposited tris(8-quinolinol) aluminum as a red luminescent layer, 4-dicyanomethylene-2-methyl-6-(p-dimethylaminostyryl)-4H-pyrane as a dopant (DCM, a doping concentration of 2.5 wt %) to a thickness of 45 nm by coevaporation.

A green luminescent area was formed by deposition of a luminescent layer as in the red area after the opening of the shadow mask was moved to be aligned over an area to be a green luminescent area. The green luminescent area was formed by depositing tris(8-hydroxyquinolinol)aluminum as a host and 2,9-dimethylquinacridone as a dopant (a doping concentration of 3 wt %) to 45 nm by coevaporation.

A blue luminescent area was also formed by deposition of a luminescent layer as in the red area after the opening of the shadow mask was moved to be aligned over an area to be a blue luminescent area. The blue luminescent area was formed by depositing 9,10-bis[4-(2,2-diphenylvinyl)phenyl] anthracene with an ionization potential of 5.70 eV to 45 nm as in the red or green area. Then, on the whole surface of the substrate was deposited bis(2-methyl-8-quinolinol)(1-phenolate)gallium with an ionization potential of 6.03 eV as an electron transporting layer to a thickness of 35 nm. Finally, over the panel substrate was placed a shadow mask with a line pattern of 270 μm width such that the mask pattern was perpendicular to the ITO and the luminescent layer pattern and the aligned mask was almost in contact with the panel substrate. On the substrate was deposited Al—Li to 30 nm as described above, from two evaporation sources by coevaporation, and then from an aluminum source to 170 nm to form a cathode. In the device, the electron transporting layer had a larger ionization potential by 0.33 eV than the luminescent layer.

Thus, an organic EL panel was prepared, which enables color display with a subpixel of 90 μm, a pixel size of 360×360 μm, a space of 30 μm and a pixel number of horizontal 320×vertical 240 dots.

Hole blocking property to blue color meant that green and red materials whose ionization potentials was smaller than that of the blue material also had hole blocking property, allowing us to achieve a highly effective luminescence in green or red color. A power consumption was, therefore, reduced from 10 W to 7 W.

An organic EL device according to this invention is, unlike a electric field-excitation luminescence type of inorganic EL device, a carrier-injection type device in which hole and electron carriers are injected from an anode and a cathode, respectively and these carriers are recombined to provide a luminescence. It has a layered structure where a luminescent layer and a charge transporting layer are combined. An appropriate combination of a luminescent and a charge transporting materials may reduce an energy barrier during injection of holes or electrons from the anode or the cathode to facilitate charge injection, and allows the charge transporting layer to play a role of a blocking layer which prevents holes or electrons from passing through the luminescent layer, by which numerical balance between holes and electrons in the luminescent layer may be improved. As a result, recombination of holes and electrons was more effective, so that an EL luminescence efficiency was improved.

The particular materials and device structure used in an organic EL device according to this invention as described above can be employed to reliably block holes injected from an anode in an electron transporting layer while blocking electrons injected from a cathode in a luminescent layer, leading to improvement in a carrier recombination efficiency. An EL luminescence efficiency is, therefore, not reduced even in a blue luminescent device and also a maximum brightness can be increased in comparison with a device using a conventional Alq3. Furthermore, penetration of holes is inhibited and an electrical efficiency is improved, so that a power consumption can be reduced; the device can be operated under low load conditions (low applied voltage); and therefore a device life can be extended. A larger ionization potential of 5.9 eV or more in the electron transporting layer allows an energy gap in a blue luminescent layer to increase and a luminescent wavelength to be reduced. It allows us to achieve a blue luminescence with a color purity, i.e., chromaticity of (0.25, 0.25) or less, which has been difficult with conventional materials.

An electron transporting material used in this invention has a higher glass-transition temperature, quite excellent deposition property and film-quality stability, and improved heat resistance, to realize operation at a higher temperature of 85° C., storage at a higher temperature and improved heat resistance, which a conventional EL device has failed to achieve.

An organic EL panel in which brightness and chromaticity are improved can be fabricated using such an organic EL device. Specifically, a simple-matrix driven (Duty 1/120) color 1/4 VGA panel with 320×240 pixels can be prepared.

What is claimed is:

1. An organic electroluminescent device comprising at least two organic compound layers consisting of a luminescent layer emitting a blue light and at least one layer selected from an electron injection layer or an electron transporting layer between heteropolar electrodes, wherein the electron injection or electron transporting layer has an ionization potential higher than that of the luminescent layer;

the electron injection or electron transporting layer comprises a compound represented by a general formula (1):

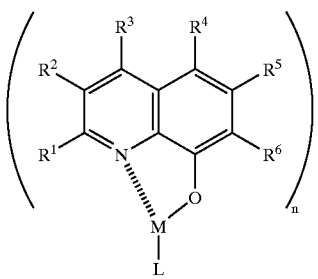

(1)

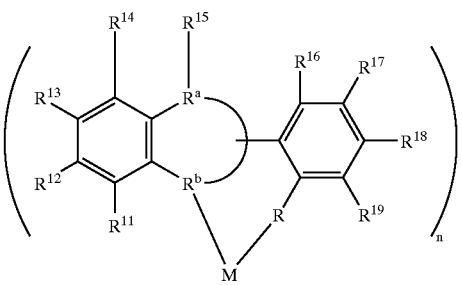

(3a)

where M represents a metal atom; $R^1$ to $R^6$, which may be different or the same, are a group independently selected from the group consisting of hydrogen atom, and halogen, alkyl, alkoxy and cyano group; L represents a ligand having a radical selected from the group consisting of halogen group, substituted or unsubstituted alkoxy group, aryloxy group, and alkyl group; and n represents 1 or 2, provided that when n is 2, groups represented by the same symbol among $R^1$ to $R^6$ may be different or the same;

the electron transporting layer has an ionization potential of at least 5.9 eV; and the luminescent layer comprises a compound represented by a general formula (2) or (3) or (3a):

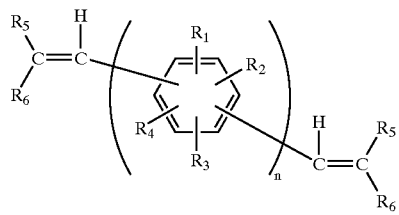

(2)

where $R^1$ to $R^4$ independently represent hydrogen atom, alkyl group, alkoxy group, aryl group, aryloxy group, amino group, and cyano group; and when n is more than one, groups represented by a common symbol among $R^1$ to $R^4$ on different rings may be different or the same; $R^5$ and $R^6$ independently represent an optionally substituted aryl with 6 to 12 carbon atoms; and n is an integer of 3 to 6,

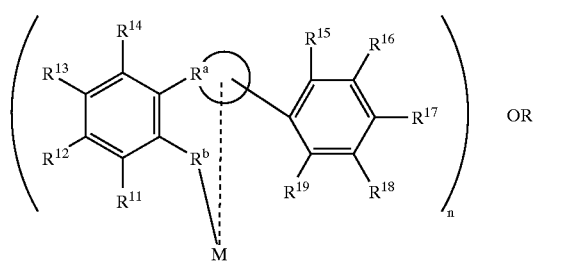

(3)

OR where M represents a metal atom; $R^{11}$ to $R^{19}$, which may be different or the same, independently represent a group selected from groups consisting of hydrogen atom, halogen group, alkyl group, alkoxy group, aryl group, and aryloxy group; $R^{11}$ to $R^{14}$ or $R^{15}$ to $R^{19}$ may be combined together to form a saturated or unsaturated ring; $R^a$ is a group which may be substituted as in $R^{11}$ to $R^{19}$, $R^b$ is a hetero atom, and $R^a$ and $R^b$ may be independently or mutually combined to form a hetero ring; n represents 2 or 3; and R represents a bivalent group.

2. An organic electroluminescent device as claimed in claim 1, wherein the luminescent layer has a hole transporting property.

3. An organic electroluminescent device as claimed in claim 1, wherein an ionization potential in the luminescent layer is less than 5.9 eV.

4. An organic electroluminescent device as claimed in claim 2, wherein an ionization potential in the luminescent layer is less than 5.9 eV.

5. An organic electroluminescent device as claimed in claim 1, wherein an ionization potential in the luminescent layer is less than or equal to 5.74 eV.

6. An organic electroluminescent device as claimed in claim 2, wherein an ionization potential in the luminescent layer is less than or equal to 5.74 eV.

7. An organic electroluminescent device as claimed in claim 1, wherein the electron transporting layer comprises at least one of gallium metal complexes.

8. An organic electroluminescent device as claimed in claim 2, wherein the electron transporting layer comprises at least one of gallium metal complexes.

9. An organic electroluminescent device as claimed in claim 3, wherein the electron transporting layer comprises at least one of gallium metal complexes.

10. An organic electroluminescent device as claimed in claim 4, wherein the electron transporting layer comprises at least one of gallium metal complexes.

11. An organic electroluminescent device as claimed in claim 5, wherein the electron transporting layer comprises at least one of gallium metal complexes.

12. An organic electroluminescent device as claimed in claim 6, wherein the electron transporting layer comprises at least one of gallium metal complexes.

13. An organic electroluminescent device as claimed in claim 1, wherein an ionization potential in the electron transporting layer is larger than an ionization potential in the luminescent layer by at least 0.1 eV.

14. An organic electroluminescent device as claimed in claim 2, wherein an ionization potential in the electron transporting layer is larger than an ionization potential in the luminescent layer by at least 0.1 eV.

15. An organic electroluminescent device as claimed in claim 1, wherein a glass transition temperature in the electron transporting layer is at least 80° C.

16. An organic electroluminescent device as claimed in claim 2, wherein a glass transition temperature in the electron transporting layer is at least 80° C.

17. A panel comprising an organic electroluminescent device claimed in claim 1.

18. A panel comprising an organic electroluminescent device claimed in claim 2.

19. A panel comprising an organic electroluminescent device claimed in claim 3.

20. A panel comprising an organic electroluminescent device claimed in claim 4.

21. A panel comprising an organic electroluminescent device claimed in claim 5.

22. A panel comprising an organic electroluminescent device claimed in claim 6.

23. A panel comprising an organic electroluminescent device claimed in claim 7.

24. A panel comprising an organic electroluminescent device claimed in claim 8.

25. A panel comprising an organic electroluminescent device claimed in claim 9.

26. A panel comprising an organic electroluminescent device claimed in claim 10.

27. A panel comprising an organic electroluminescent device claimed in claim 11.

28. A panel comprising an organic electroluminescent device claimed in claim 12.

29. A panel comprising an organic electroluminescent device claimed in claim 13.

30. A panel comprising an organic electroluminescent device claimed in claim 14.

31. A panel comprising an organic electroluminescent device claimed in claim 15.

32. A panel comprising an organic electroluminescent device claimed in claim 16.

* * * * *